United States Patent [19]

Louw et al.

[11] 4,221,980
[45] Sep. 9, 1980

[54] ELECTRICAL SWITCHING MEANS

[75] Inventors: Wynand J. Louw, Randburg; Douw G. van der Merwe, Pretoria; Carel J. F. Coetzee, Roodepoort, all of South Africa

[73] Assignee: South African Inventions Development Corporation, Pretoria, South Africa

[21] Appl. No.: 896,444

[22] Filed: Apr. 14, 1978

[51] Int. Cl.² ........................................... H03K 17/00
[52] U.S. Cl. ................................ 307/255; 307/252 C; 307/288
[58] Field of Search ............... 307/288, 252 C, 252 A, 307/254, 255, 296

[56] References Cited

U.S. PATENT DOCUMENTS

| | | | |
|---|---|---|---|
| 3,235,750 | 2/1966 | Anderson et al. | 307/288 |
| 3,348,068 | 10/1967 | Miller | 307/288 |
| 3,416,008 | 12/1968 | Memelink et al. | 307/288 |
| 4,125,787 | 11/1978 | Ohhinata et al. | 307/252 C |

Primary Examiner—Stanley D. Miller, Jr.
Assistant Examiner—B. P. Davis

[57] ABSTRACT

This invention provides an electrical switch which has regenerative ON and OFF switching and which is latched. The switch has a main switching transistor, a latching transistor, a plurality of auxiliary current enhancing transistors and a switch-off transistor. The base and collector of the latching transistor are connected with the collector and base respectively of the main transistor to act as a latch. The auxiliary transistors are connected in parallel with the latching transistor, with the bases and collectors of the auxiliary transistors connected with the latching transistor's collector, and with the emitters of the auxiliary transistors and the latching transistor being connected. Finally, the switch-off transistor is connected across the base emitter junction of the main transistor.

16 Claims, 2 Drawing Figures

ELECTRICAL SWITCHING MEANS

GENERAL DESCRIPTION OF THE INVENTION

This invention relates to an electrical switching means. It relates more particularly to a switchable, latched, regenerative electrical switch.

According to the invention there is provided a switchable, latched, regenerative electrical switch having a first and a second power terminal and a control terminal, which includes a main switching element that is switchable and which has a first and a second power terminal and a control terminal;

a latching element that is switchable and which has a first and a second power terminal and a control terminal, the control terminal of the latching element being connected with the first power terminal of the main element and the control terminal of the main element being connected with the first power terminal of the latching element; and an auxiliary current enhancing element which has a first and a second terminal and which is connected in parallel with the latching element, the first terminal of the auxiliary element being connected with the second power terminal of the latching element and the second terminal of the auxiliary element being connected with the control terminal of the latching element, the auxiliary element being such that when there is, in use, a current flow therethrough the latching element is maintained in a conductive mode;

with the junction between the first terminal of the auxiliary element and the second power terminal of the latching element constituting the first power terminal of the switch, the junction between the control terminal of the main element and the first power terminal of the latching element constituting the control terminal of the switch, and the second power terminal of the main element constituting the second power terminal of the switch.

By this means, the current through the main element is not only the control current of the latching element and the control current of the main element but also the current through the auxiliary element. Thereby, the main element is more effectively operated and utilised.

The two terminals of the auxiliary element may be power terminals and the auxiliary element may also have a control terminal which is also connected with the control terminal of the latching element. Conveniently, a plurality of auxiliary elements may be provided, the first terminal of each auxiliary element being connected with the second power terminal of the latching element, and the second terminal of each auxiliary element being connected with the control terminal of the latching element. A number of switches may be utilised in parallel with each other. The switch may be switched on or off by means of a pulse or a continuous signal. If the switch is to be switched on or off by means of a continuous signal, suitable buffer or interfacing elements may be provided to protect the various elements of the switch.

The main element, the latching element and the auxiliary element may be uni-directional with the first and second power terminals of the main element constituting its input and output terminal, respectively; with the first and second terminals of the auxiliary element constituting its input and output terminals respectively; and with the first and second power terminals of the switch constituting its input and output terminals respectively, such that the switch is also uni-directional. Alternatively, the first and second power terminals of the main element may constitute its output and input terminals respectively; the first and second power terminals of the latching element may constitute its input and output terminals respectively; and the first and second terminals of the auxiliary element may constitute its output and input terminals respectively such that the first and second power terminals of the switch constitute its output and input terminals respectively.

By "uni-directional" is meant that the element may conduct current in one direction only, from its input to its output.

The main, latching and auxiliary elements may be solid state devices. In particular, the main element may be a NPN bi-polar transistor with its collector, base and emitter constituting its first power terminal, control terminal and second power terminal respectively, and the latching element may be a PNP bi-polar transistor with its collector, base and emitter constituting its first power terminal, control terminal and second power terminal respectively. Alternatively, the main element may be a PNP bi-polar transistor with its collector, base and emitter constituting its first power terminal, control terminal and second power terminal respectively, and the latching element may be a NPN bi-polar transistor with its collector, base and emitter constituting its first power terminal, control terminal and second power terminal respectively. Similarly, the auxiliary element may be a PNP bi-polar transistor with its emitter, base and collector constituting its first power terminal, control terminal and second power terminal respectively, or it may be a NPN bi-polar transistor with its emitter, base and collector constituting its first power terminal, control terminal and second power terminal respectively.

Preferably, the latching element and the auxiliary elements are similar. If the main element is such that the current flow between its power terminals is substantially a constant multiple of the current flow through its control terminal, then there may be the same number of auxiliary elements as the integer value closest to the constant multiple.

However, the various elements may also be any other suitable, electrical device. Thus, they may be thermionic devices, relays, parametric amplifiers, or the like. It will also be appreciated that the auxiliary elements need not be controllable. They could for example be rectifying devices, such as an ordinary rectifying diode or a zener diode, which have a sufficient voltage drop to maintain the latching element in a conducting mode, or even a resistor.

The switch may further include a switch-off element that is switchable and which has a first and a second power terminal and a control terminal with the first power terminal of the switch-off element being connected with the control terminal of the main element; and the second power terminal of the switch-off element being connected with the second power terminal of the main element such that the control terminal of the switch-off element constitutes a switch-off terminal of the switch.

The switch-off element may also be uni-directional, having an input terminal, a control terminal and an output terminal; with the input terminal of the switch-off element being connected with the control terminal of the main element; the output terminal of the switch-off element being connected with the output terminal of the main element; and the control terminal of the switch-off element constituting a switch-off terminal of the switch. Alternatively, the switch-off element may have its input terminal connected with the input terminal of the main element; its output terminal connected with the control terminal of the main element; and its control terminal constituting a switch-off terminal of the switch, depending on the configuration utilised.

Again, the switch-off element may be a solid state electronic device or any other suitable device. Preferably, the switch-off element is a NPN bi-polar transistor with its collector, base and emitter constituting its input terminal, control terminal and output terminal respectively.

The invention is now described, by way of examples, with reference to the accompanying drawings, in which.

Figure 1:
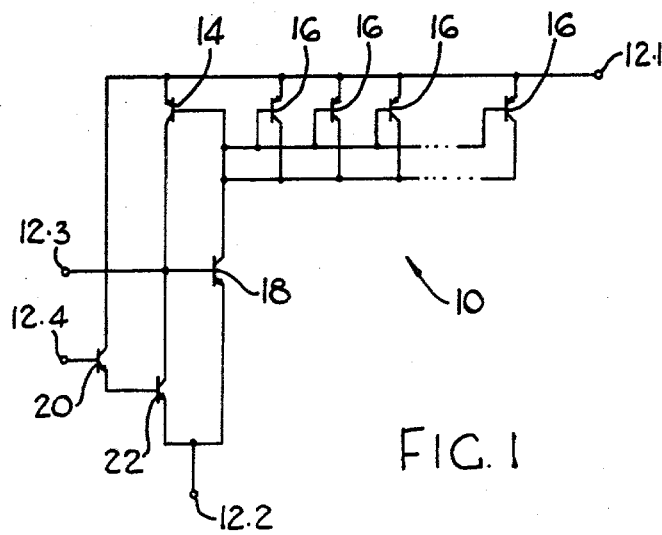
FIG. 1 shows a circuit diagram of a switch according to the invention.

Referring to FIG. 1 a latched, regenerative, unidirectional electronic power switch is shown referred to generally by numeral 10. The switch 10 has an input terminal 12.1, an output terminal 12.2, a switch-on terminal 12.3 and a switch-off terminal 12.4.

The switch 10 comprises a latching bi-polar PNP transistor 14, a number of auxiliary bi-polar PNP transistors 16, a main bi-polar NPN transistor 18 and two bi-polar NPN transistors 20 and 22 which together act to switch the switch 10 off.

As shown, the emitters of the latching transistor 14 and the auxiliary transistors 16 are connected to the input terminal 12.1; the base of the latching transistor 14 and the bases and collectors of the auxiliary transistors 16 are connected to the collector of the main transistor 18; the collector of the latching transistor 14, the base of the main transistor 18 and the collector of the switch-off transistor 22 are connected to the switch-on terminal 12.3 of the switch 10; the emitters of the main transistor 18 and the switch-off transistor 22 are connected to the output terminal 12.2 of the switch 10; the collector of the switch-off transistor 20 is also connected to the input terminal 12.1 of the switch 10; the emitter of the switch-off transistor 20 is connected to the base of the other switch-off transistor 22; and the base of the switch-off transistor 20 is connected to the switch-off terminal 12.4 of the switch 10.

The latching transistor 14 and the auxiliary transistors 16 are similar and may be formed on one chip in an integrated circuit package. Accordingly, in operation, as the base-emitter voltages of these transistors will be the same, their base and collector currents will be substantially the same. There are accordingly provided as many auxiliary transistors 16 as the integer closest to the desired ratio of collector current to base current of the main transistor 18. This ratio is chosen so as to ensure that the main transistor 18 is saturated under all operating conditions when the switch is in the ON state. Saturation of transistor 18 implies saturation of transistor 14.

In operation, when a positive trigger pulse is applied to the switch-on terminal 12.3 of the switch 10, the main transistor 18 draws collector current, which is supplied via the base of the latching transistor 14 and the bases and collectors of the auxiliary transistors 16. The latching transistor 14 starts switching on, increasing the base drive of the main transistor 18. By a regenerative action the latching, auxiliary and main transistors 14, 16, 18 are driven on and current flows through the switch 10 from the input terminal 12.1 to the output terminal 12.2.

To turn the switch off, a positive pulse is applied to the switch-off terminal 12.4. This turns the switch-off transistors 20 and 22 on. As the collector-emitter saturation voltage of the switch-off transistor 22 is lower than the base-emitter voltage of the main transistor 18, the main transistor 18 starts switching off. The latching transistor 14 and the auxiliary transistors 16 start switching off due to a regenerative action; the latching, auxiliary, and main transistors 14, 16 and 18 switch-off, turning the switch OFF.

In order to protect the switch-off transistor 22, if a continuous signal is applied to the switch-off terminal 12.4, the collector of the switch-off transistor 20 may be connected to a suitable supply, via a safety resistor.

Figure 2:
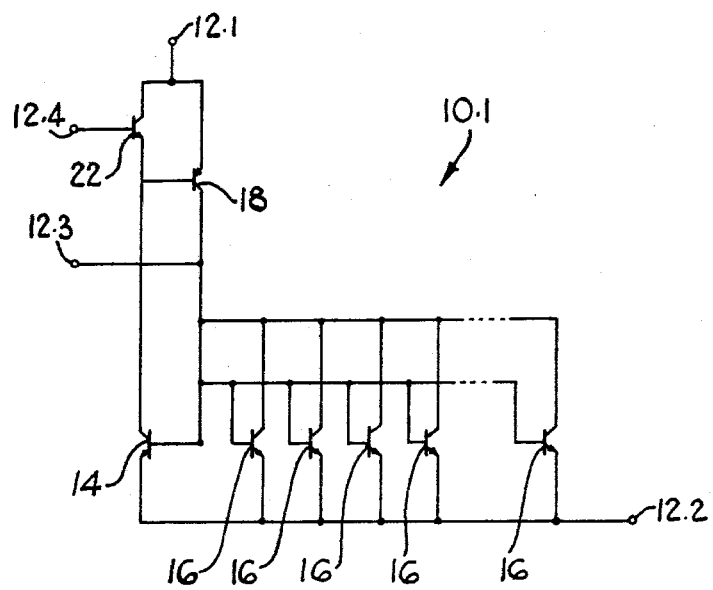
FIG. 2 shows a circuit diagram of a complementary switch to that shown in FIG. 1.

Referring to FIG. 2, a switch 10.1 is shown, which is complementary to the switch 10 of FIG. 1. The switch 10.1 also has an input terminal 12.1, an output terminal 12.2, a switch-on terminal 12.3 and a switch-off terminal 12.4; and comprises a latching transistor 14, a number of auxiliary transistors 16, a main transistor 18 and switch-off transistors 22. The transistors 14, 16, 18, and 22 are connected as shown in FIG. 2 in a manner similar but complementary to the switch 10 of FIG. 1. The operation of the switch 10.1 is analogous to that of the switch 10 and will not be considered further.

The switch 10 of FIG. 1 may also be switched ON by the application of a negative pulse to the base of the latching transistor 14 and the switch 10.1 of FIG. 2 may be switched ON by a negative pulse applied to the base of the main transistor 18.

By these means a power switch capable of switching 50 A, with a blocking voltage of 80 V, and being switched on in less than 1,5 microseconds and being switched off in about 1 microsecond by a switch-off pulse of 8 mA applied for 10 microseconds, has been provided.

It is to be understood still further that although use is made of the terms "input" and "output" in regard to the terminals of the switching elements, this is not to be regarded as implying that the switching elements necessarily have directional characteristics. Thus, the switching elements may also, for example, be relays, the input and output terminals then being the contactor terminals.

Finally, although, the switching elements are indicated as being three terminal devices, they may in certain cases be only two terminal devices. For example, in the embodiment of FIG. 1, instead of the auxiliary transistors 16, diodes may be utilised.

We claim:

1. A switchable, latched, regenerative electrical power switch having a first and a second power terminal and a control terminal, which includes
a main switching element that is switchable and which has a first and a second power terminal and a control terminal;
a latching element that is switchable and which has a first and a second power terminal and a control terminal, the control terminal of the latching element being connected with the first power terminal of the main element and the control terminal of the main element being connected with the first power terminal of the latching element; and
a number of auxiliary current enhancing elements each having a first and a second power terminal and which are connected in parallel with the latching element, the first terminal of each auxiliary element being connected with the second power terminal of the latching element and the second terminal of each auxiliary element being connected with the control terminal of the latching element, each auxiliary element also having a control terminal which is also connected with the control terminal of the latching element, the auxiliary elements being such that when there is, in use, a current flow therethrough the latching element is maintained in a conductive mode;

with the junction between the first terminals of the auxiliary elements and the second power terminal of the latching element constituting the first power terminal of the switch, the junction between the control terminal of the main element and the first power terminal of the latching element constituting the control terminal of the switch, and the second power terminal of the main element constituting the second power terminal of the switch, the latching element and auxiliary elements being similar, the main element being such that the current flow between its power terminals is substantially a constant multiple of the current flow through its control terminal, said number of auxiliary elements being the same as the integer value closest to the constant multiple.

2. A switch as claimed in claim 1, in which the main element, the latching element and the auxiliary elements are uni-directional with the first and second power terminals of the main element constituting its input and output terminal, respectively; with the first and second power terminals of the latching element constituting its output and input terminals respectively; with the first and second terminals of the auxiliary elements constituting its input and output terminals respectively; and with the first and second power terminals of the switch constituting its input and output terminals respectively.

3. A switch as claimed in claim 2, which includes a uni-directional switchable switch-off element having an input terminal, a control terminal and an output terminal; with the input terminal of the switch-off element connected with the control terminal of the main element; the output terminal of the switch-off element connected with the output terminal of the main element; and the control terminal of the switch-off element constituting a switch-off terminal of the switch.

4. A switch as claimed in claim 3, in which the switch-off element is a NPN bi-polar transistor with its collector, base and emitter constituting its input terminal, control terminal and output terminal respectively.

5. A switch as claimed in claim 1, in which the main element, the latching element and the auxiliary elements are uni-directional,
with the first and second power terminals of the main element constituting its output and input terminals respectively;
with the first and second power terminals of the latching element constituting its input and output terminals respectively;
with the first and second terminals of the auxiliary elements constituting its output and input terminals respectively; and
with the first and second power terminals of the switch constituting its output and input terminals respectively.

6. A switch as claimed in claim 5, which includes a uni-directional switchable switch-off element having an input terminal, a control terminal and an output terminal; with the input terminal of the switch-off element connected with the input terminal of the main element; the output terminal of the switch-off element being connected with the control terminal of the main element; and the control terminal of the switch-off element constituting a switch-off terminal of the switch.

7. A switch as claimed in claim 6, in which the switch-off element is a NPN bi-polar transistor with its collector, base and emitter constituting its input terminal, control terminal and output terminal respectively.

8. A switch as claimed in claim 1, in which the main element is a NPN bi-polar transistor with its collector, base and emitter constituting its first power terminal, control terminal and second power terminal respectively.

9. A switch as claimed in claim 1, in which the latching element is a PNP bi-polar transistor with its collector, base and emitter constituting its first power terminal, control terminal and second power terminal respectively.

10. A switch as claimed in claim 1, in which the main, latching and auxiliary elements are solid state electronic devices.

11. A switch as claimed in claim 1, in which the main element is a PNP bi-polar transistor with its collector, base and emitter constituting its first power terminal, control terminal and second power terminal respectively.

12. A switch as claimed in claim 1, in which the latching element is a NPN bi-polar transistor with its collector, base end emitter constituting its first power terminal, control terminal and second power terminal respectively.

13. A switch as claimed in claim 1, in which each auxiliary element is a PNP bi-polar transistor with its emitter, base and collector constituting its first power terminal, control terminal and second power terminal respectively.

14. A switch as claimed in claim 1, in which each auxiliary element is a NPN bi-polar transistor with its emitter, base and collector constituting its first power terminal, control terminal and second power terminal respectively.

15. A switch as claimed in claim 1, which includes
a switch-off element that is switchable and which has a first and a second power terminal and a control terminal; and
the first power terminal of the switch-off element is connected with the control terminal of the main element;
the second power terminal of the switch-off element is connected with the second power terminal of the main element; and
the control terminal of the switch-off element constitutes a switch-off terminal of the switch.

16. A switch as claimed in claim 5, in which the switch-off element is a solid state electronic device.

* * * * *